(12) United States Patent
Kim et al.

(10) Patent No.: US 10,635,530 B2
(45) Date of Patent: Apr. 28, 2020

(54) MEMORY SYSTEM PERFORMING ERROR CORRECTION OF ADDRESS MAPPING TABLE

(71) Applicant: SAMSUNG ELECTRONICS CO., LTD., Gyeonggi-do (KR)

(72) Inventors: Hyunsik Kim, Seoul (KR); Tae-Hwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

(21) Appl. No.: 15/718,143

(22) Filed: Sep. 28, 2017

(65) Prior Publication Data

US 2018/0129563 A1 May 10, 2018

(30) Foreign Application Priority Data

Nov. 7, 2016 (KR) .......................... 10-2016-0147679

(51) Int. Cl.
*G06F 11/00* (2006.01)
*G06F 11/10* (2006.01)
*G11C 29/52* (2006.01)
*G06F 12/1009* (2016.01)

(52) U.S. Cl.
CPC ...... *G06F 11/1068* (2013.01); *G06F 11/1048* (2013.01); *G06F 12/1009* (2013.01); *G11C 29/52* (2013.01); *G06F 2212/65* (2013.01); *G06F 2212/7201* (2013.01)

(58) Field of Classification Search
None
See application file for complete search history.

(56) References Cited

U.S. PATENT DOCUMENTS

| | | | |
|---|---|---|---|
| 8,219,776 B2 | 7/2012 | Forhan et al. | |
| 8,250,333 B2 | 8/2012 | Gorobets et al. | |
| 8,671,330 B2* | 3/2014 | Komagome | G06F 11/1016 714/768 |
| 8,694,865 B2 | 4/2014 | Baek et al. | |
| 8,738,987 B2 | 5/2014 | Ahn et al. | |
| 8,838,936 B1 | 9/2014 | Salessi et al. | |
| 9,268,682 B2 | 2/2016 | Tomlin et al. | |
| 9,367,392 B2 | 6/2016 | Michael | |
| 2004/0186946 A1* | 9/2004 | Lee | G06F 3/0616 711/103 |
| 2006/0242212 A1* | 10/2006 | Brinkmann | G06F 3/0619 |
| 2010/0174869 A1 | 7/2010 | Gorobets et al. | |
| 2011/0072194 A1 | 3/2011 | Forhan et al. | |
| 2011/0271164 A1 | 11/2011 | Ahn et al. | |

(Continued)

*Primary Examiner* — Daniel F. McMahon
(74) *Attorney, Agent, or Firm* — Sughrue Mion, PLLC

(57) ABSTRACT

A memory system includes a nonvolatile memory device, a dynamic random access memory (DRAM) configured to store an address mapping table for an access to the nonvolatile memory device, and a controller configured to store, in the DRAM, the address mapping table that is divided in units of address mapping data, each of the units having a size of an interface of the DRAM, read, from the stored address mapping table, target address mapping data corresponding to a logical address that is received from a host, the target address mapping data including a target parity and physical addresses of the nonvolatile memory device, and perform an error correction on the read target address mapping data, using the target parity.

15 Claims, 11 Drawing Sheets

(56) References Cited

U.S. PATENT DOCUMENTS

| | | |
|---|---|---|
| 2012/0166910 A1 | 6/2012 | Baek et al. |
| 2013/0019057 A1 | 1/2013 | Stephens |
| 2014/0101369 A1 | 4/2014 | Tomlin et al. |
| 2016/0034346 A1 | 2/2016 | Michael |
| 2018/0018100 A1* | 1/2018 | Aho .................. G06F 3/0608 |
| 2018/0173419 A1* | 6/2018 | Dubeyko ............. G06F 3/061 |

* cited by examiner

MEMORY SYSTEM PERFORMING ERROR CORRECTION OF ADDRESS MAPPING TABLE

CROSS-REFERENCE TO RELATED APPLICATION

This application claims priority from Korean Patent Application No. 10-2016-0147679 filed Nov. 7, 2016, in the Korean Intellectual Property Office, the disclosure of which is incorporated herein by reference in its entirety.

BACKGROUND

1. Field

Apparatuses consistent with example embodiments relate to a semiconductor memory device, and more particularly, to a memory system that performs error correction of an address mapping table.

2. Description of the Related Art

Semiconductor memory devices are roughly divided into a volatile memory device and a nonvolatile memory device. Read and write speeds of the volatile memory device are fast, but data stored therein disappears when a power supply is interrupted. In contrast, the nonvolatile memory device retains data stored therein even though external power is interrupted. Therefore, the nonvolatile memory device is used to store information to be retained regardless of whether power is supplied. As the nonvolatile memory, a flash memory is higher in integration than a conventional EEPROM, thus being applicable to a high-capacity auxiliary storage device.

The flash memory is being used as a storage medium for replacing a hard disk drive (HDD) due to the advance of technologies and a competitive price of the flash memory. A flash memory based storage device is being manufactured for use in a solid state drive (SSD), an SD card, etc. The storage device includes a controller for controlling the flash memory.

The controller includes a flash translation layer that manages a logical address used in a host and a physical address used in the flash memory. The flash translation layer manages an address mapping table for translating a logical address into a physical address. The controller may perform error detection and correction on data stored in the storage device. Also, the controller performs the error detection and correction of an address mapping table.

SUMMARY

Example embodiments provide a memory system that quickly performs error detection and correction on an address mapping table for a nonvolatile memory device, which is stored in a dynamic random access memory.

According to an aspect of an example embodiment, there is provided a memory system including a nonvolatile memory device, a dynamic random access memory (DRAM) configured to store an address mapping table for an access to the nonvolatile memory device, and a controller configured to store, in the DRAM, the address mapping table that is divided in units of address mapping data, each of the units having a size of an interface of the DRAM, read, from the stored address mapping table, target address mapping data corresponding to a logical address that is received from a host, the target address mapping data including a target parity and physical addresses of the nonvolatile memory device, and perform an error correction on the read target address mapping data, using the target parity.

According to another aspect of an example embodiment, there is provided a memory system including a nonvolatile memory device, a DRAM configured to store an address mapping table for an access to the nonvolatile memory device, and a controller configured to store, in the DRAM, the address mapping table that is divided in units of address mapping data, each of the units having a size of an interface of the DRAM, and access the nonvolatile memory device by performing an error detection and correction on target address mapping data corresponding to the access, among the stored address mapping table, the target address mapping data including physical addresses of the nonvolatile memory device and a target parity corresponding to the physical addresses.

According to another aspect of an example embodiment, there is provided a method of controlling a memory system including a nonvolatile memory device and a dynamic random access memory (DRAM), the method including receiving, from a host, a request to translate a logical address that is used by the host to a target physical address of the nonvolatile memory device, reading target address mapping data corresponding to the logical address of the received request, from pieces of address mapping data that are stored in the DRAM, the target address mapping data including a target parity and target physical addresses of the nonvolatile memory device, correcting an error of the target physical addresses included in the read target address mapping data, using the target parity, and outputting the target physical address corresponding to the logical address, among the target physical addresses of which the error is corrected.

DETAILED DESCRIPTION

Figure 1:
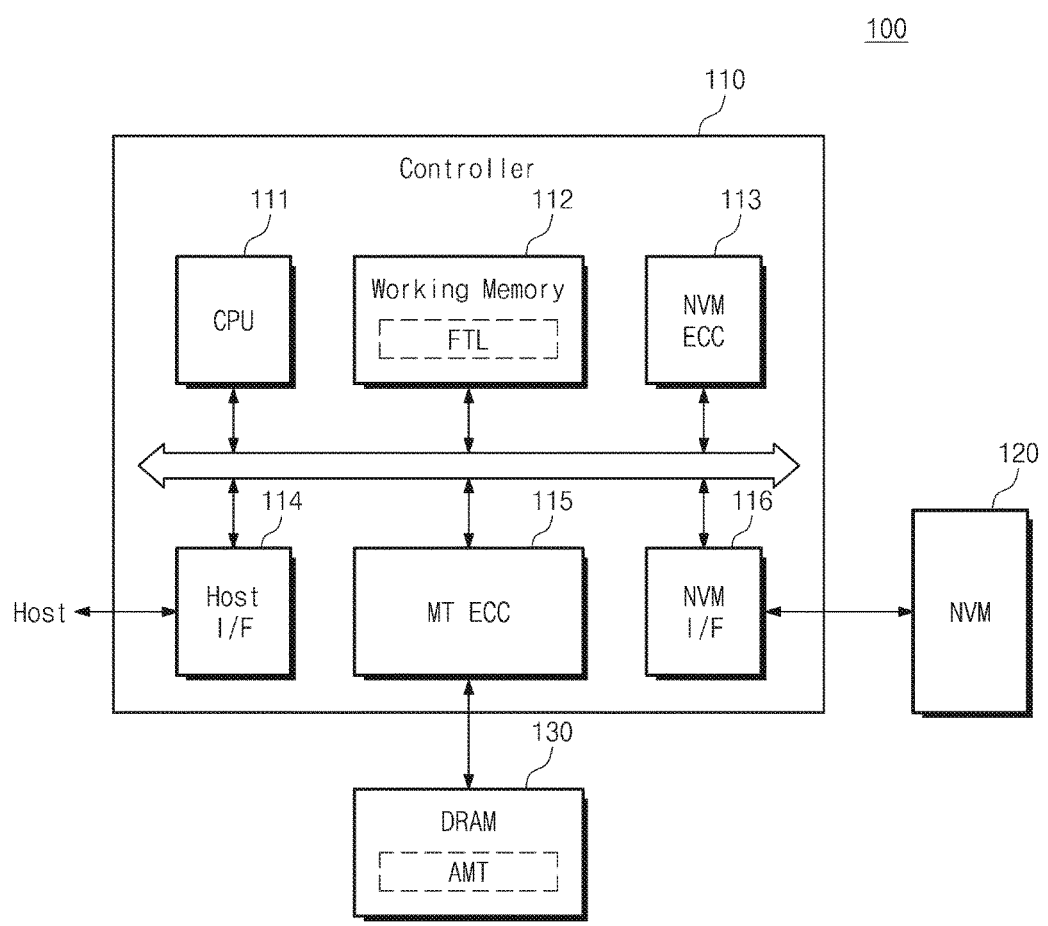
FIG. 1 is a block diagram illustrating a memory system, according to an example embodiment.

FIG. 1 is a block diagram illustrating a memory system 100, according to an example embodiment. Referring to FIG. 1, the memory system 100 may include a memory controller 110, a nonvolatile memory device 120, and a dynamic random access memory (DRAM) 130. The memory system 100 may exchange data with a host through an input/output port. The memory system 100 may store or read data in or from the nonvolatile memory device 120 in response to a write or read request received from the host.

The controller 110 provides a physical connection between the host and the memory system 100. That is, the controller 110 may provide an interface between the host and the memory system 100 in compliance with the bus format of the host. The controller 110 may drive firmware to control the memory system 100. The controller 110 may include a central processing unit (CPU) 111, a working memory 112, a nonvolatile memory error correction circuit 113, a host interface 114, a mapping table error correction circuit 115, and a nonvolatile memory interface 116.

The CPU 111 may perform overall operations of the controller 110. The CPU 111 may be configured to drive the firmware for controlling the controller 110. The firmware may be loaded and driven on the working memory 112. The CPU 111 may decode an instruction that is provided from the host. The CPU 111 may control the nonvolatile memory error correction circuit 113, the mapping table error correction circuit 115, and/or the nonvolatile memory interface 116 to perform a command for an access (e.g., a write operation or a read operation), which is included in the instruction.

The firmware for controlling the controller 110 and data are stored in the working memory 112. The stored firmware and data are driven by the CPU 111. The working memory 112 may include any one or any combination of a cache memory device, a DRAM device, a phase-change RAM (PRAM) device, and a flash memory device. For example, a flash translation layer FTL may be stored in the working memory 112.

Read and write operations of the nonvolatile memory device 120 may be performed in units of a page, and an erase operation thereof may be performed in units of a block. Due to the above-described characteristic of the nonvolatile memory device 120, read, write, and erase operations of the nonvolatile memory device 120 are managed. The flash translation layer FTL is system software (or firmware) that is developed for such as purpose. The flash translation layer FTL may allow the nonvolatile memory device 120 to operate in response to an access (e.g., a read or write operation) that is requested from the host. For example, the flash translation layer FTL manages an address mapping table AMT for matching a logical address used in the host and a physical address used in the nonvolatile memory device 120. The address mapping table AMT may be stored in the DRAM 130. The flash translation layer FTL may be loaded on the working memory 112 and may be driven by the CPU 111.

The nonvolatile memory error correction circuit 113 may generate an error correction code by encoding data stored in the DRAM 130 at the write request. In this case, the encoded data and the error correction code may be stored in the nonvolatile memory device 120. The error correction circuit 113 may decode data, which are read from the nonvolatile memory device 120 at the read request, by using an error correction code. Here, the error correction code may be included in the read data.

The host interface 114 may provide a physical connection between the host and the memory system 100. That is, the host interface 114 may provide an interface between the host and the memory system 100 in compliance with the bus format of the host. For example, the bus format of the host may be implemented with a variety of interface protocols such as universal serial bus (USB), multimedia card (MMC), peripheral component interconnection (PCI), PCI-express (PCI-E), advanced technology attachment (ATA), serial ATA (SATA), parallel ATA (PATA), small computer small interface (SCSI), enhanced small disk interface (ESDI), integrated drive electronics (IDE) protocols, etc.

The mapping table error correction circuit 115 may control read and write operations of the DRAM 130. For example, the mapping table error correction circuit 115 may temporarily store write data received from the host in the DRAM 130. Also, the mapping table error correction circuit 115 may temporarily store read data, which are read from the nonvolatile memory device 120, in the DRAM 130.

The mapping table error correction circuit 115 may perform an error correction operation on the address mapping table AMT stored in the DRAM 130. For example, the flash translation layer FTL may manage the address mapping table AMT for matching a logical address used in the host and a physical address used in the nonvolatile memory device 120. The address mapping table AMT may be used to translate a logical address used in the host into a physical address used in the nonvolatile memory device 120. The address mapping table AMT may be stored in the nonvolatile memory device 120 and may be loaded on the DRAM 130 if the memory system 100 is powered. The size of the address mapping table AMT increases in proportion to a capacity of the nonvolatile memory device 120. The address mapping table AMT may occupy 80% of the capacity of the DRAM 130. Accordingly, an error of the address mapping table AMT is managed, and thus, an error correction operation for the address mapping table AMT is performed separately from data stored in the nonvolatile memory device 120.

The mapping table error correction circuit 115 may receive an address translation request or an address write request from the CPU 111. For example, when the CPU 111 receives a request for reading data stored in the nonvolatile memory device 120 from the host, the CPU 111 may provide the mapping table error correction circuit 115 with the address translation request for translating a logical address corresponding to the read request of the host. When the mapping table error correction circuit 115 receives the address translation request, the mapping table error correction circuit 115 may obtain a physical address of the nonvolatile memory device, which corresponds to the received logical address, by using the address mapping table AMT. In this case, the mapping table error correction circuit 115 may perform an error correction operation on a portion of the address mapping table AMT, in which the requested physical address is included.

When the CPU 111 receives a request for writing or erasing data in or from the nonvolatile memory device 120 from the host, the CPU 111 may provide the mapping table error correction circuit 115 with the address write request associated with a logical address corresponding to the write or erase request of the host. When the mapping table error correction circuit 115 receives the address write request, the mapping table error correction circuit 115 may change a physical address of the nonvolatile memory device, which corresponds to the received logical address, to another physical address or may delete address mapping associated with the physical address. In this case, the mapping table error correction circuit 115 may perform an error correction operation on a portion of the address mapping table AMT, in which the requested physical address is included.

For example, the mapping table error correction circuit 115 may correct a 1-bit error and may detect a 2-bit error. The mapping table error correction circuit 115 may correct an error by using a hamming code. However, example embodiments of the inventive concept may not be limited thereto.

The nonvolatile memory interface 116 may exchange data with the nonvolatile memory device 120. For example, the nonvolatile memory interface 116 may provide data received from the DRAM 130 to the nonvolatile memory device 120. Data read from the nonvolatile memory device 120 may be stored in the DRAM 130 through the nonvolatile memory interface 116.

The nonvolatile memory device 120 may be provided as storage medium of the memory system 100. For example, the nonvolatile memory device 120 may be implemented with a high-capacity NAND-type flash memory. Also, the storage medium of the nonvolatile memory device 120 may be implemented with a PRAM, a MRAM, a ReRAM, a FRAM, a NOR flash memory, etc., and a memory system including heterogeneous memory devices may be used as the storage medium of the nonvolatile memory device 120. A volatile memory device (e.g., DRAM) may be included as a storage medium.

Write data that are provided from the host or data that are read from the nonvolatile memory device 120 may be temporarily stored in the DRAM 130. When the host issues a read request, if data that are present in the nonvolatile memory device 120 is cached, the DRAM 130 may support a cache function for providing the cached data directly to the host. In this case, an access to the nonvolatile memory device 120 may not occur. A data transfer rate by the bus format (e.g., SATA or SAS) of the host is much higher than a data transfer rate of a memory channel of the nonvolatile memory device 120. That is, a decrease in performance due to a speed difference may be minimized by providing the high-capacity DRAM 130 when an interface speed of the host is markedly high. The DRAM 130 may be a synchronous DRAM (SDRAM) for sufficient buffering in the memory system 100 used as a high-capacity auxiliary memory device. However, it is apparent to those skilled in the art that the DRAM 130 is not limited thereto.

The DRAM 130 may store the address mapping table AMT. For example, the address mapping table AMT may be used to translate a logical address used in the host into a physical address used in the nonvolatile memory device 120. The address mapping table AMT may be stored in the nonvolatile memory device 120 and may be loaded on the DRAM 130 if the memory system 100 is powered. The size of the address mapping table AMT increases in proportion to a capacity of the nonvolatile memory device 120. The address mapping table AMT may occupy 80% of the capacity of the DRAM 130.

According to an example embodiment of the inventive concept, the memory system 100 may include the mapping table error correction circuit 115, which performs an error correction operation on the address mapping table AMT that is stored in the DRAM 130 and is managed by the flash translation layer FTL, separately from the nonvolatile memory error correction circuit 113 that performs an error correction operation on data stored in the nonvolatile memory device 120. Accordingly, the memory system 100 may detect and correct an error of the address mapping table AMT that is used to operate the nonvolatile memory device 120. This may mean that the memory system 100 secures the reliability of an access to the nonvolatile memory device 120.

Figure 2:
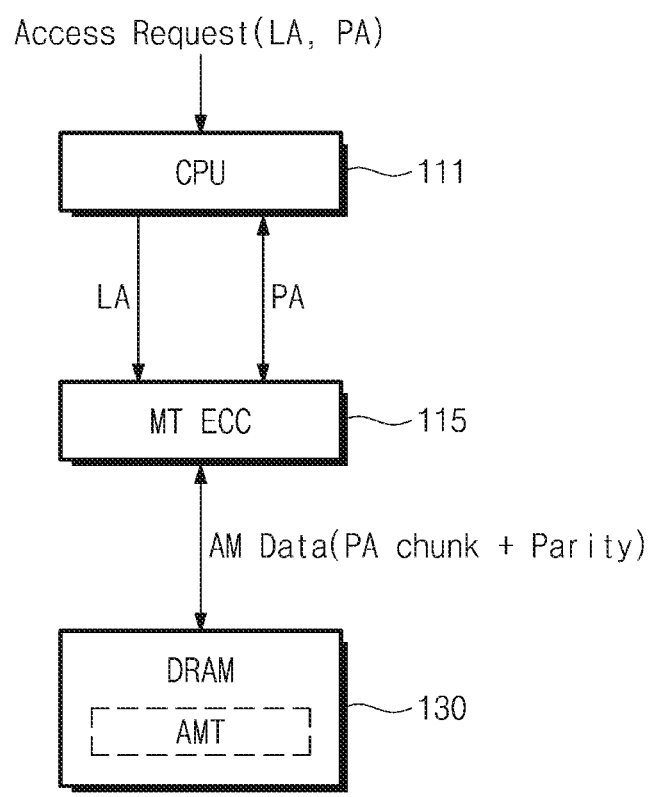
FIG. 2 is a block diagram illustrating an operation of a mapping table error correction circuit, according to an example embodiment.

FIG. 2 is a block diagram illustrating an operation of the mapping table error correction circuit 115, according to an example embodiment. Referring to FIG. 2, the CPU 111 may receive a request for an access to the nonvolatile memory device 120 from the host. For example, the CPU 111 may receive a logical address LA together with a read request. Alternatively, the CPU 111 may receive a logical address LA and a physical address PA together with a write request.

When the CPU 111 receives a read request from the host, the CPU 111 may transfer the received logical address to the mapping table error correction circuit 115. The mapping table error correction circuit 115 may read address mapping (AM) data corresponding to the received logical address, from the DRAM 130. The mapping table error correction circuit 115 may perform an error correction operation on the address mapping data by using a parity included in the address mapping data. The mapping table error correction circuit 115 may obtain a physical address corresponding to the logical address from the address mapping data after performing the error correction operation, and may transfer the obtained physical address to the CPU 111.

For example, the address mapping data may include a physical address chunk and a parity. The physical address chunk is a set of physical addresses of the nonvolatile memory device 120. The parity may be generated according to the physical address chunk and may be included in a piece of address mapping data together with the physical address chunk. As an example embodiment, the size of the address mapping data may be set to be the same as the size of an input/output interface of the DRAM 130. Also, the size of the address mapping data may be set to be smaller than the size of the input/output interface of the DRAM 130. However, the size of the address mapping data is not limited thereto. The size of the address mapping data may be variably set according to an example embodiment. The address mapping table AMT may include a plurality of pieces of address mapping data.

When the CPU 111 receives a write request from the host, the CPU 111 may transfer the received logical address and a new physical address to the mapping table error correction circuit 115. The mapping table error correction circuit 115 may read address mapping data corresponding to the received logical address from the DRAM 130. The mapping table error correction circuit 115 may perform an error correction operation on the address mapping data by using a parity included in the address mapping data. The mapping table error correction circuit 115 may change a physical address corresponding to the logical address to the new physical address after performing the error correction operation. The mapping table error correction circuit 115 may generate a new parity corresponding to a new physical address chunk including the new physical address. The mapping table error correction circuit 115 may combine the new physical address chunk and the new parity and may store new address mapping data in the DRAM 130. The mapping table error correction circuit 115 may overwrite the new address mapping data on previous address mapping data.

Figure 3:
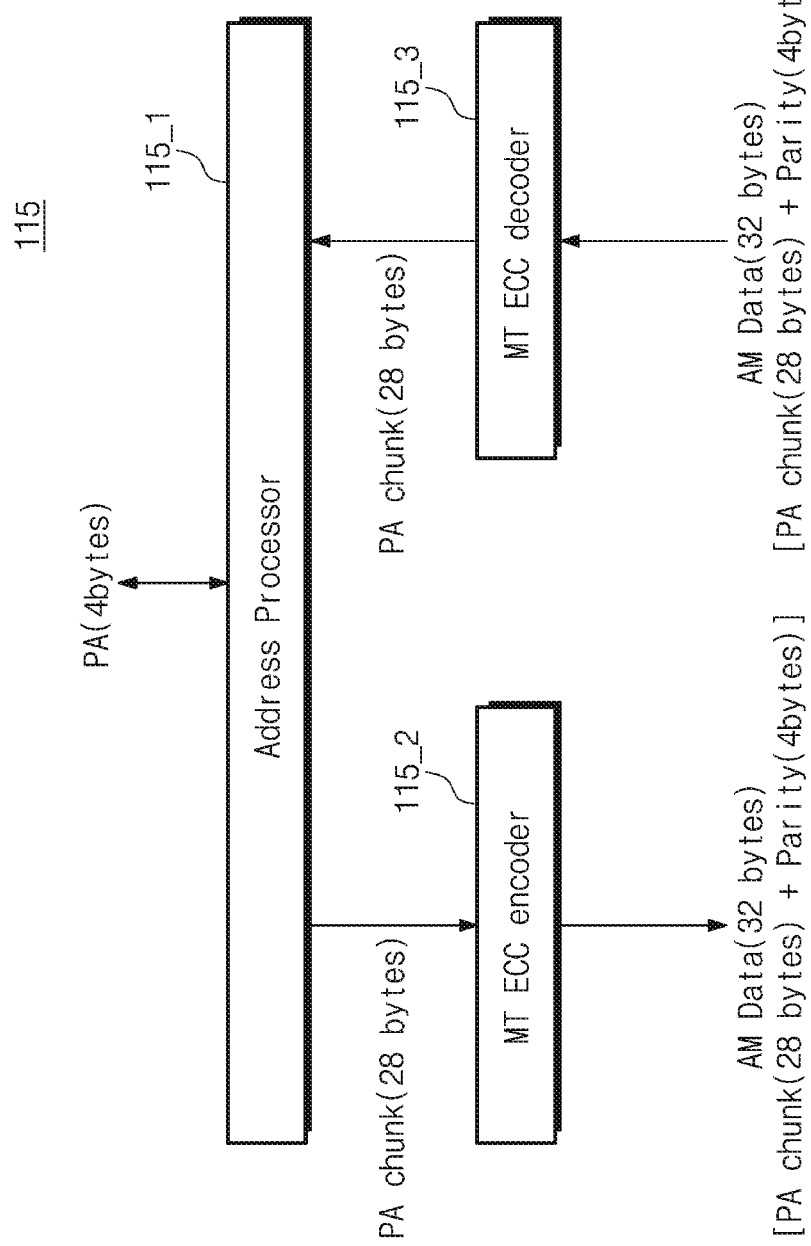
FIG. 3 is a block diagram illustrating a mapping table error correction circuit of FIG. 2.

FIG. 3 is a block diagram illustrating the mapping table error correction circuit 115 of FIG. 2. Referring to FIG. 3, the mapping table error correction circuit 115 may include an address processor 115_1, a mapping table error correction encoder 115_2, and a mapping table error correction decoder 115_3.

Upon encoding a physical address, the address processor 115_1 may receive a plurality of physical addresses to generate a physical address chunk, or may replace the received physical addresses in an existing physical address chunk. The mapping table error correction encoder 115_2 may generate a parity corresponding to the physical address chunk. Also, the mapping table error correction encoder 115_2 may combine the physical address chunk and the parity to generate address mapping data. The mapping table error correction encoder 115_2 may store the generated address mapping data in the DRAM 130.

Upon decoding a physical address, the mapping table error correction decoder 115_3 may read address mapping data corresponding to a received logical address from the DRAM 130. The mapping table error correction decoder 115_3 may divide the address mapping data into a physical address chunk and a parity. The mapping table error correction decoder 115_3 may perform an error correction operation on the physical address chunk by using the parity. The mapping table error correction decoder 115_3 may correct a 1-bit error of the physical address chunk, or may detect a 2-bit error of the physical address chunk. The mapping table error correction decoder 115_3 may transfer the error-corrected physical address chunk to the address processor 115_1. The address processor 115_1 may obtain a physical address corresponding to a received logical address, from a physical address chunk. The address processor 115_1 may transfer the obtained physical address to the CPU 111.

In an example embodiment, each of a physical address and a parity may have the size of 4 bytes. A physical address chunk may include seven physical addresses, thus having the size of 28 bytes. Address mapping data is composed of a physical address chunk of 28 bytes and the parity of 4 bytes, thus having the size of 32 bytes. The 32-byte size may be the same as the size of an input/output interface of the DRAM 130. This is only an example, and the size of address mapping data may change with the size of the input/output interface of the DRAM 130. Also, the number of physical addresses included in one physical address chunk may be variable.

Figure 4:
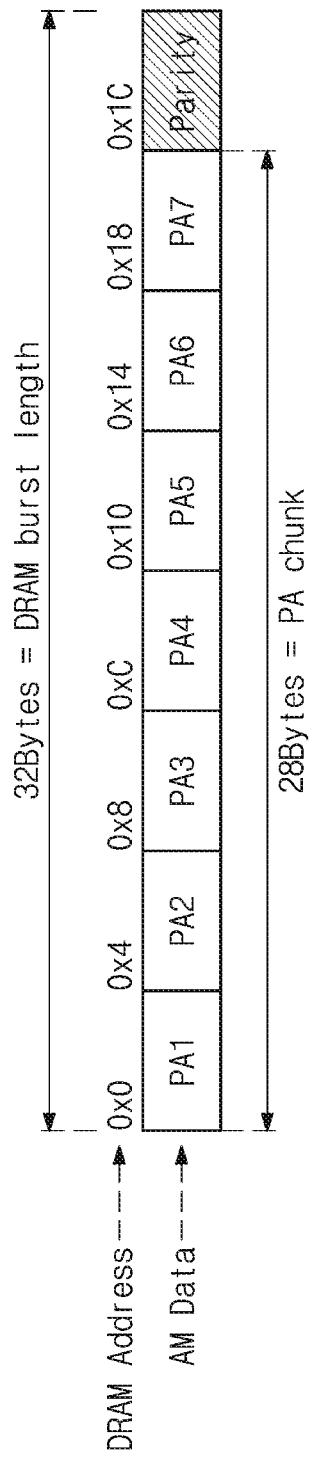
FIG. 4 is a diagram illustrating a piece of address mapping data according to an example embodiment.

FIG. 4 is a diagram illustrating a piece of address mapping data according to an example embodiment. Referring to FIG. 4, a piece of address mapping (AM) data may include first to seventh physical addresses PA1 to PA7 and a parity. For example, the first to seventh physical addresses PA1 to PA7 may constitute one physical address (PA) chunk. Each of the first to seventh physical addresses PA1 to PA7 and the parity may have the size of 4 bytes. Accordingly, a piece of address mapping data may have the size of 32 bytes, which is the same as a burst length of the DRAM 130. That is, the size of an input/output interface of the DRAM 130 is 32 bytes.

The first to seventh physical addresses PA1 to PA7 and the parity may be stored after addresses 0x0 to 0x1C of the DRAM 130 are respectively assigned to the first to seventh physical addresses PA1 to PA7. The addresses 0x0 to 0x1C of the DRAM 130 may be used as logical addresses of the first to seventh physical addresses PA1 to PA7 and the parity.

Figure 5:
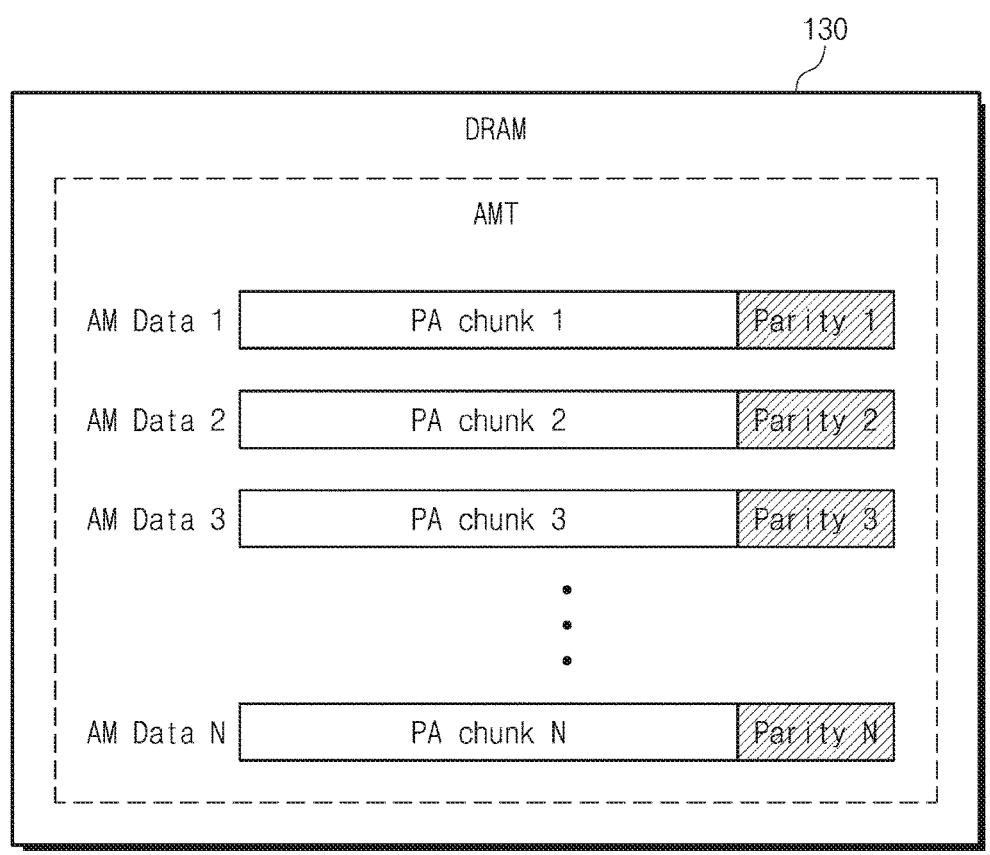
FIG. 5 is a diagram illustrating an address mapping table stored in a DRAM, according to an example embodiment.

FIG. 5 is a diagram illustrating an address mapping table AMT stored in the DRAM 130, according to an example embodiment. Referring to FIG. 5, the DRAM 130 may store the address mapping table AMT. For example, the address mapping table AMT may be stored in units of address mapping data. That is, the address mapping table AMT may include first to N-th address mapping data AM Data 1 to AM Data N. The first to N-th address mapping data AM Data 1 to AM Data N may include physical address chunks PA chunk 1 to PA chunk N and parities Parity 1 to Parity N, respectively.

Figure 6:
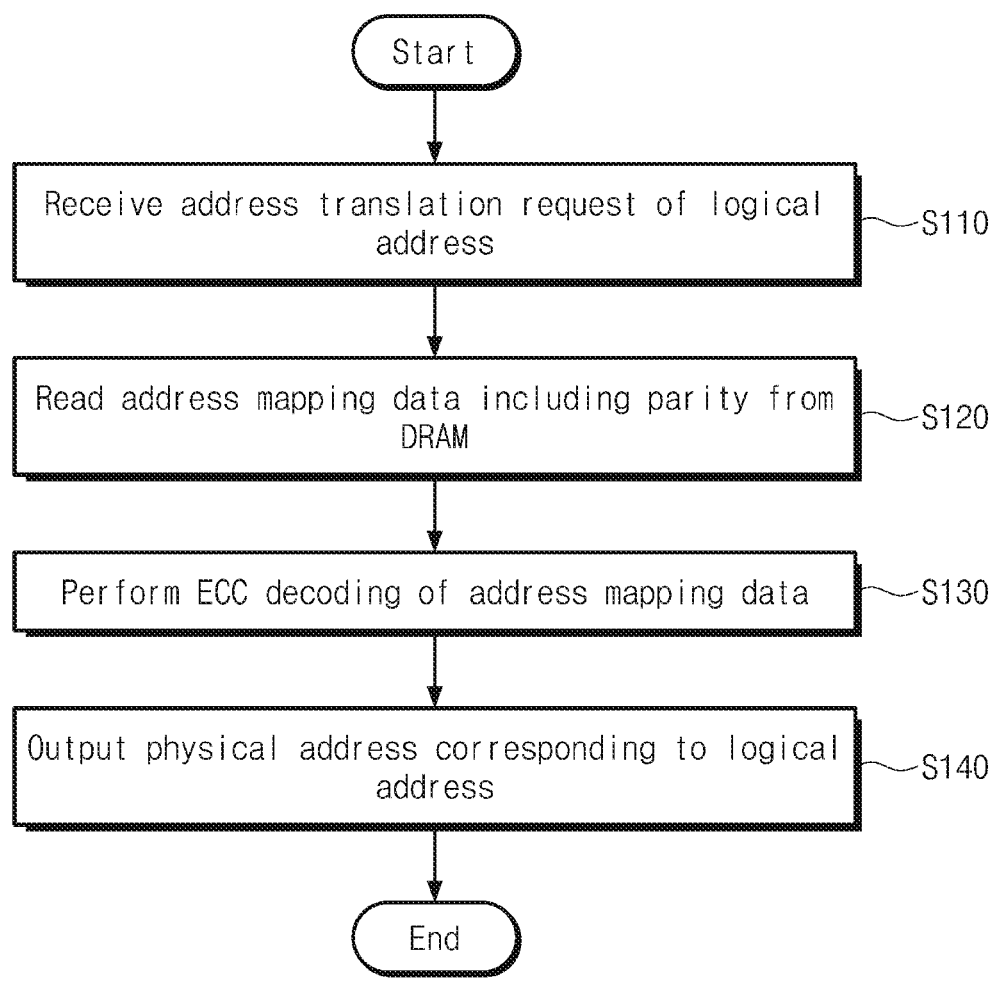
FIG. 6 is a flowchart illustrating an address translation operation, according to an example embodiment.

FIG. 6 is a flowchart illustrating an address translation operation, according to an example embodiment. Referring to FIG. 6, an address translation operation may be performed when the controller 110 receives a read request.

In operation S110, the mapping table error correction circuit 115 may receive an address translation request for translating a logical address, from the CPU 111. For example, the logical address is an address that is received from the host. The mapping table error correction circuit 115 may receive the logical address from the CPU 111.

In operation S120, the mapping table error correction circuit 115 may read address mapping data corresponding to the logical address, from the DRAM 130. For example, the mapping table error correction decoder 115_3 may read the address mapping data including parity.

In operation S130, the mapping table error correction circuit 115 may perform an error correction decoding operation of the address mapping data. For example, the mapping table error correction decoder 115_3 may divide the address mapping data into a physical address chunk and a parity. The mapping table error correction decoder 115_3 may detect and correct an error of the physical address chunk by using the parity. The mapping table error correction decoder 115_3 may correct a 1-bit error and may detect a 2-bit error. The error-corrected physical address chunk may be transferred to the address processor 115_1.

In operation S140, the mapping table error correction circuit 115 may output a physical address corresponding to the logical address. For example, the address processor 115_1 may obtain a physical address corresponding to the logical address from the error-corrected physical address chunk. The address processor 115_1 may transfer the obtained physical address to the CPU 111.

According to an example embodiment of the inventive concept, the controller 110 may perform an error correction operation upon reading the address mapping table AMT stored in the DRAM 130. Also, the address mapping table AMT may be stored in units of address mapping data that are composed of a physical address chunk and a parity. Accordingly, the controller 110 may perform an error correction operation on a physical address corresponding to the logical address through one read operation. This may mean that the controller 110 secures the reliability of the address mapping table AMT and reduces a time used to correct an error of the address mapping table AMT.

Figure 7:
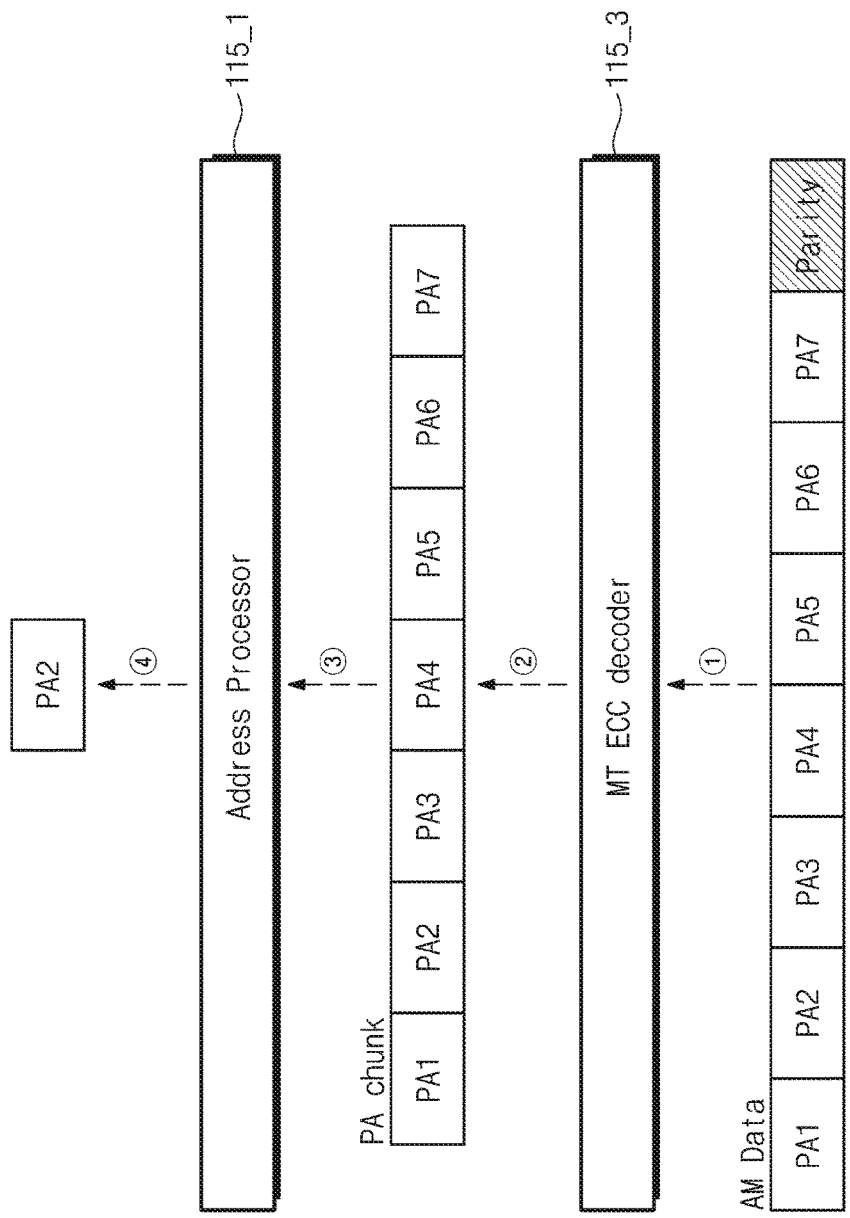
FIG. 7 is a diagram illustrating an address translation operation of FIG. 6.

FIG. 7 is a diagram illustrating an address translation operation of FIG. 6. Referring to FIG. 7, in operation 1, if an address translation request for translating a logical address corresponding to a second physical address PA2 is received from the CPU 111, the mapping table error correction decoder 115_3 may read address mapping data, which include the first to seventh physical addresses PA1 to PA7 and a parity, from the DRAM 130. In operation 2, the mapping table error correction decoder 115_3 may divide the address mapping data into a physical address chunk, which includes the first to seventh physical addresses PA1 to PA7, and the parity. The mapping table error correction decoder 115_3 may detect and correct an error of the physical address chunk by using the parity. In operation 3, the address processor 115_1 receives physical address chunk from the mapping table error correction decoder 115_3. In operation 4, the address processor 115_1 may obtain the second physical address PA2 corresponding to a received logical address from the physical address chunk.

Figure 8:
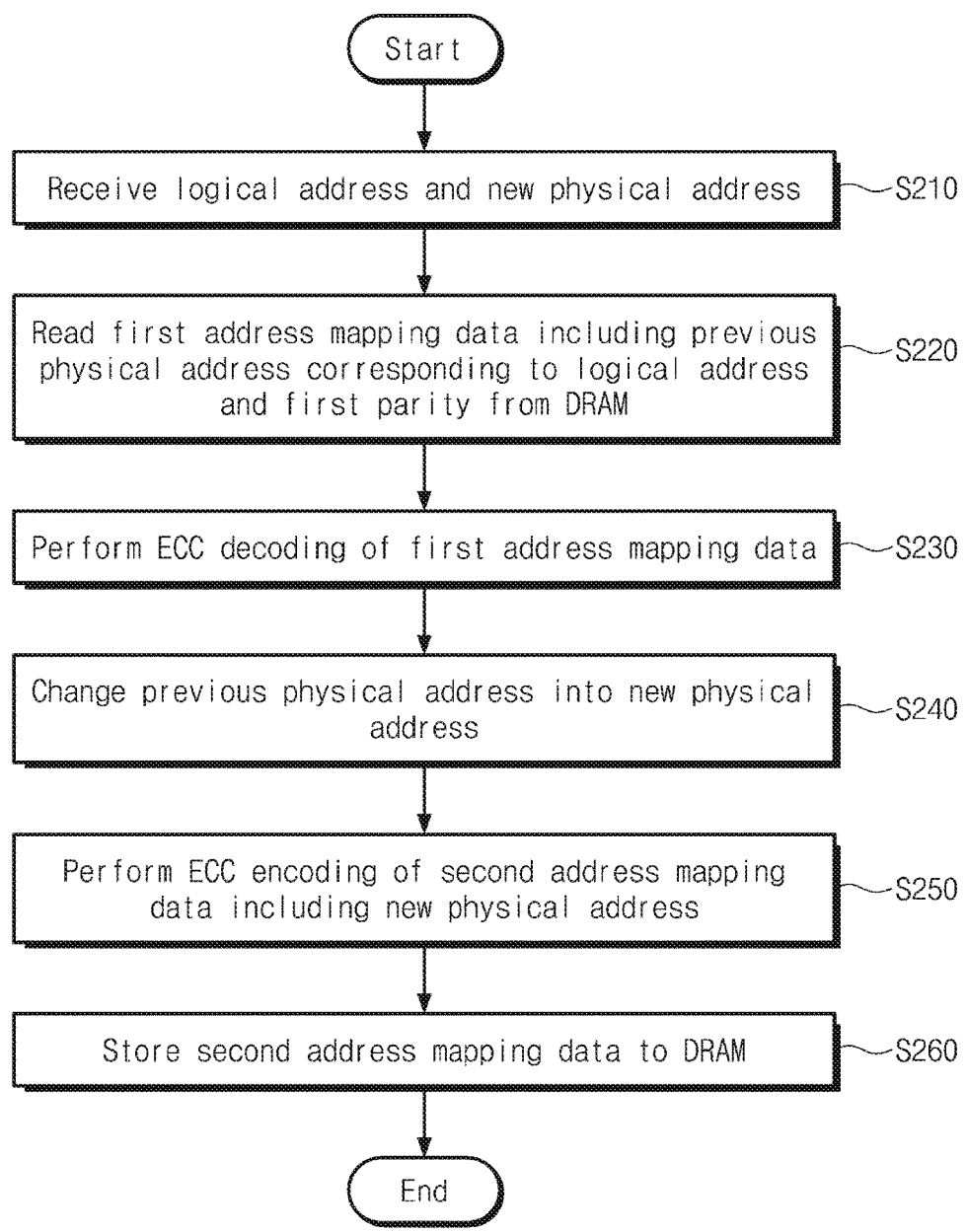
FIG. 8 is a flowchart illustrating an address write operation, according to an example embodiment.

FIG. 8 is a flowchart illustrating an address write operation, according to an example embodiment. Referring to FIG. 8, an address write operation may be performed when the controller 110 receives a write request.

In operation S210, the mapping table error correction circuit 115 may receive a logical address and a new physical address corresponding to the logical address, from the CPU 111. For example, because the nonvolatile memory device 120 does not support an overwrite function, a logical address has to be mapped to a new physical address to write new data in the nonvolatile memory device 120.

In operation S220, the mapping table error correction circuit 115 may read first address mapping data corresponding to the logical address, from the DRAM 130. For example, the mapping table error correction decoder 115_3 may read the first address mapping data including a previous physical address and a first parity.

In operation S230, the mapping table error correction circuit 115 may perform an error correction decoding operation of the first address mapping data. For example, the mapping table error correction decoder 115_3 may divide the first address mapping data into a first physical address chunk and a first parity. The mapping table error correction decoder 115_3 may detect and correct an error of the first physical address chunk by using the first parity. The mapping table error correction decoder 115_3 may correct a 1-bit error and may detect a 2-bit error. The error-corrected first physical address chunk may be transferred to the address processor 115_1.

In operation S240, the mapping table error correction circuit 115 may change the previous physical address into a new physical address. For example, the address processor 115_1 may generate a second physical address chunk including the new physical address by replacing the previous physical address with the new physical address in the first physical address chunk. The second physical address chunk may be transferred to the mapping table error correction encoder 115_2.

In operation S250, the mapping table error correction circuit 115 may perform an error correction encoding operation of the second address mapping data including the new physical address. For example, the mapping table error correction encoder 115_2 may generate a second parity corresponding to the second physical address chunk. The mapping table error correction encoder 115_2 may combine the second physical address chunk and the second parity to generate the second address mapping data.

In operation S260, the mapping table error correction circuit 115 may store the second address mapping data to the DRAM 130. For example, the mapping table error correction encoder 115_2 may overwrite the second address mapping data on the first address mapping data.

According to an example embodiment of the inventive concept, the controller 110 may perform an error correction operation upon changing the address mapping table AMT stored in the DRAM 130. When the controller 110 changes the address mapping table AMT, the controller 110 may generate new address mapping data after reading previous address mapping data. An error of the address mapping table may be corrected upon reading the previous address mapping data.

Figure 9:
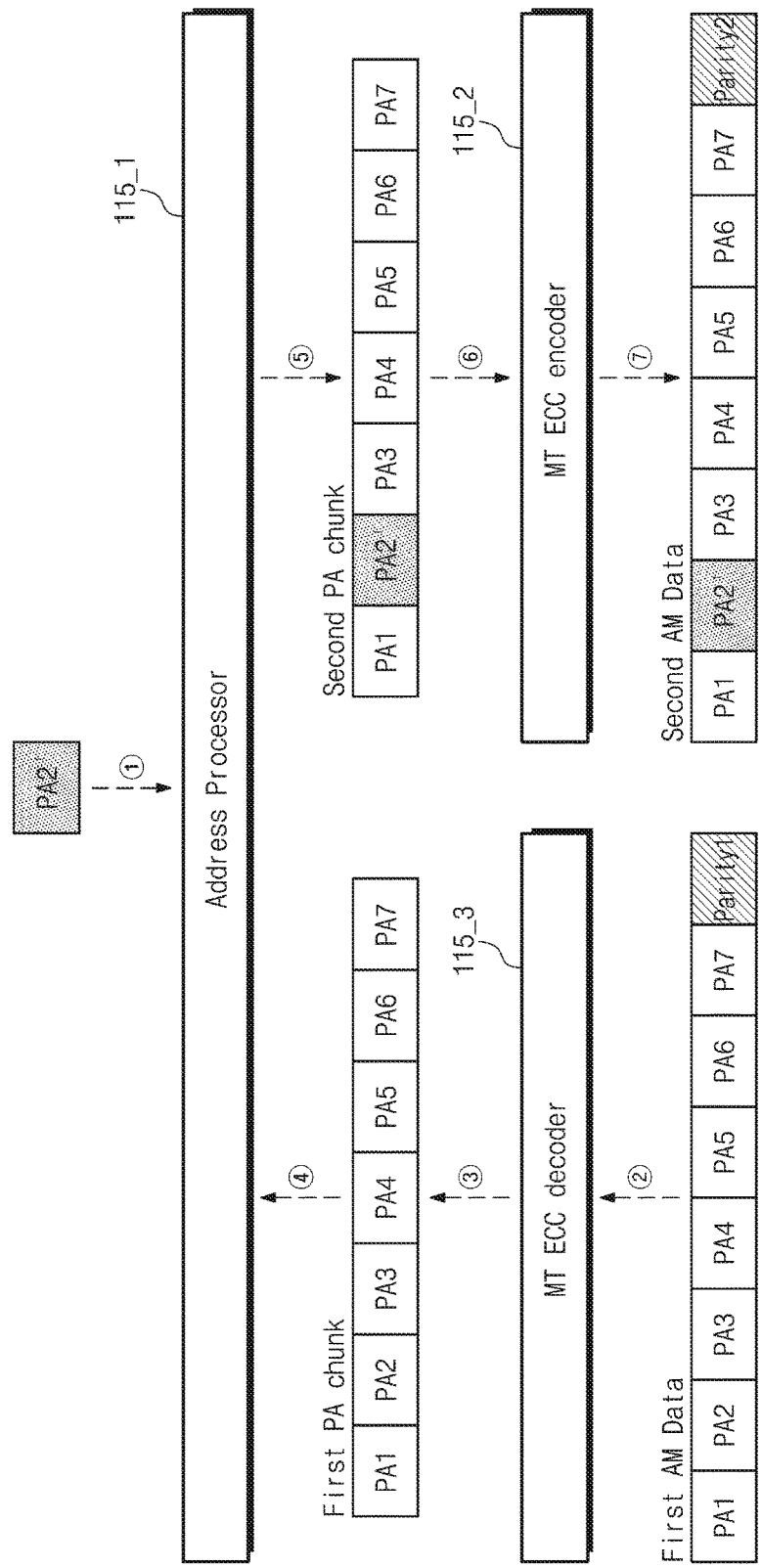
FIG. 9 is a diagram illustrating an address write operation of FIG. 8.

FIG. 9 is a diagram illustrating an address write operation of FIG. 8. Referring to FIG. 9, in operation 1, the mapping table error correction circuit 115, namely, the address processor 115_1, may receive an address write request associated with a logical address corresponding to a second physical address PA2 and a new second physical address PA2' from the CPU 111. In operation 2, if the address write request of the logical address corresponding to the second physical address PA2 is received from the CPU 111, the mapping table error correction decoder 115_3 may read first address mapping data, which include the first to seventh physical addresses PA1 to PA7 and a first parity Parity 1, from the DRAM 130. In operation 3, the mapping table error correction decoder 115_3 may divide the first address mapping data into a first physical address chunk, which includes the first to seventh physical addresses PA1 to PA7, and the first parity. The mapping table error correction decoder 115_3 may detect and correct an error of the first physical address chunk by using the first parity. In operation 4, the address processor 115_1 receives the first physical address chunk from the mapping table error correction decoder 115_3.

In operation 5, the address processor 115_1 may remove the second physical address PA2 from the first physical address chunk and may insert the new second physical address PA2' into the first physical address chunk to generate a second physical address chunk. In operation 6, the address processor 115_1 may provide the mapping table error correction encoder 115_2 with the second physical address chunk including the new second physical address PA2'. In operation 7, the mapping table error correction encoder 115_2 may generate a second parity, based on the second physical address chunk. The mapping table error correction encoder 115_2 may combine the second physical address chunk and the second parity to generate second address mapping data. The generated second address mapping data may be overwritten on the first address mapping data in the DRAM 130.

Figure 10:
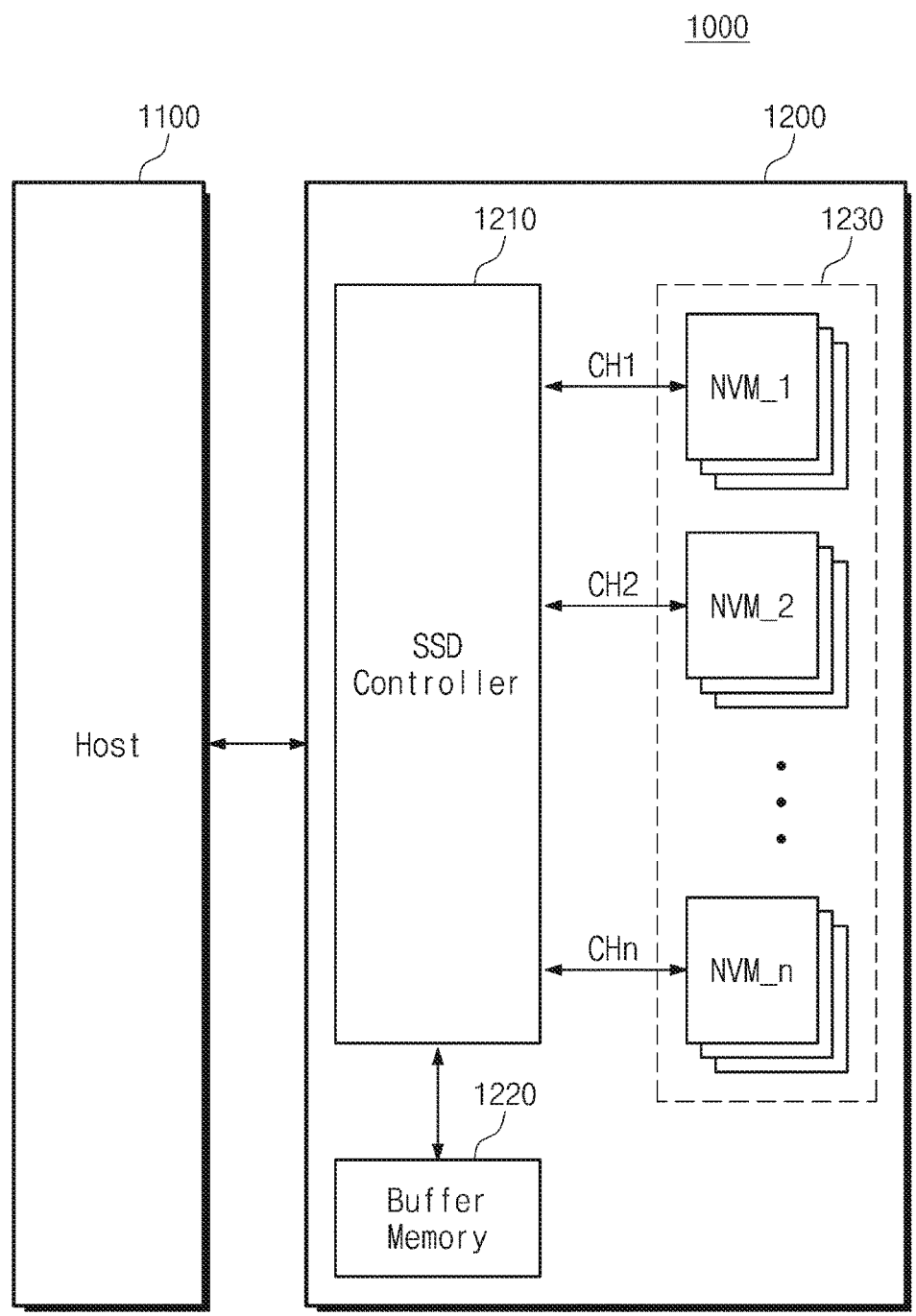
FIG. 10 is a block diagram illustrating a solid state drive (SSD) system, according to an example embodiment.

FIG. 10 is a block diagram illustrating a solid state drive (SSD) system 1000, according to an example embodiment. Referring to FIG. 10, the SSD system 1000 may include a host 1100 and a SSD 1200. The SSD 1200 may include a SSD controller 1210, a buffer memory 1220, and nonvolatile memory devices 1230.

The SSD controller 1210 may provide a physical connection between the host 1100 and the SSD 1200. That is, the SSD controller 1210 may provide an interface between the host 1100 and the SSD 1200 in compliance with the bus format of the host. The SSD controller 1210 may decode an instruction provided from the host 1100. The SSD controller 1210 may access the nonvolatile memory devices 1230, based on the decoded result. The bus format of the host may include a universal serial bus (USB), a small computer system interface (SCSI), a PCI express, an advanced technology attachment (ATA), a parallel ATA (PATA), a serial ATA (SATA), a serial attached SCSI (SAS), etc.

Also, the SSD controller 1210 may include the mapping table error correction circuit 115 described with reference to FIGS. 1 to 9. Accordingly, the SSD controller 1210 may perform an error correction operation on an address mapping table stored in the buffer memory 1220 through one read operation.

The buffer memory 1220 may temporarily store write data provided from the host 1100 or data read from the nonvolatile memory devices 1230. When the host 1100 issues a read request, if data that are present in the nonvolatile memory devices 1230 is cached, the buffer memory 1220 may support a cache function for providing the cached data directly to the host 1100. A data transfer rate by the bus format (e.g., SATA or SAS) of the host is much higher than a data transfer rate of a memory channel of the SSD 1200. That is, a decrease in performance due to a speed difference may be minimized by providing the high-capacity buffer memory 1220 when an interface speed of the host is markedly high. Also, the buffer memory 1220 may store the address mapping table of the nonvolatile memory devices 1230.

The buffer memory 1220 may be a SDRAM for sufficient buffering in the SSD 1200 used as a high-capacity auxiliary storage device. However, it is apparent to those skilled in the art that the buffer memory 1220 is not limited thereto.

The nonvolatile memory devices 1230 NVM_1 to NVM_n may be provided as storage medium of the SSD 1200. For example, the nonvolatile memory devices 1230 may be implemented with a high-capacity NAND-type flash memory. The nonvolatile memory devices 1230 may be connected with the SSD controller 1210 through a plurality of channels CH1 to CHn. An example embodiment is exemplified as the nonvolatile memory devices 1230 are implemented with an NAND flash memory as storage medium. However, example embodiments of the inventive concept may not be limited thereto. For example, the nonvolatile memory devices 1230 may be implemented with nonvolatile memory devices that are different from the NAND flash memory. For example, the storage medium of the nonvolatile memory devices 1230 may be implemented with a PRAM, a MRAM, a ReRAM, a FRAM, a NOR flash memory, and the like, and a memory system including different types of memory devices may be used as the storage medium of the nonvolatile memory device 1230. A volatile memory device (e.g., DRAM) may be included as a storage medium.

Figure 11:
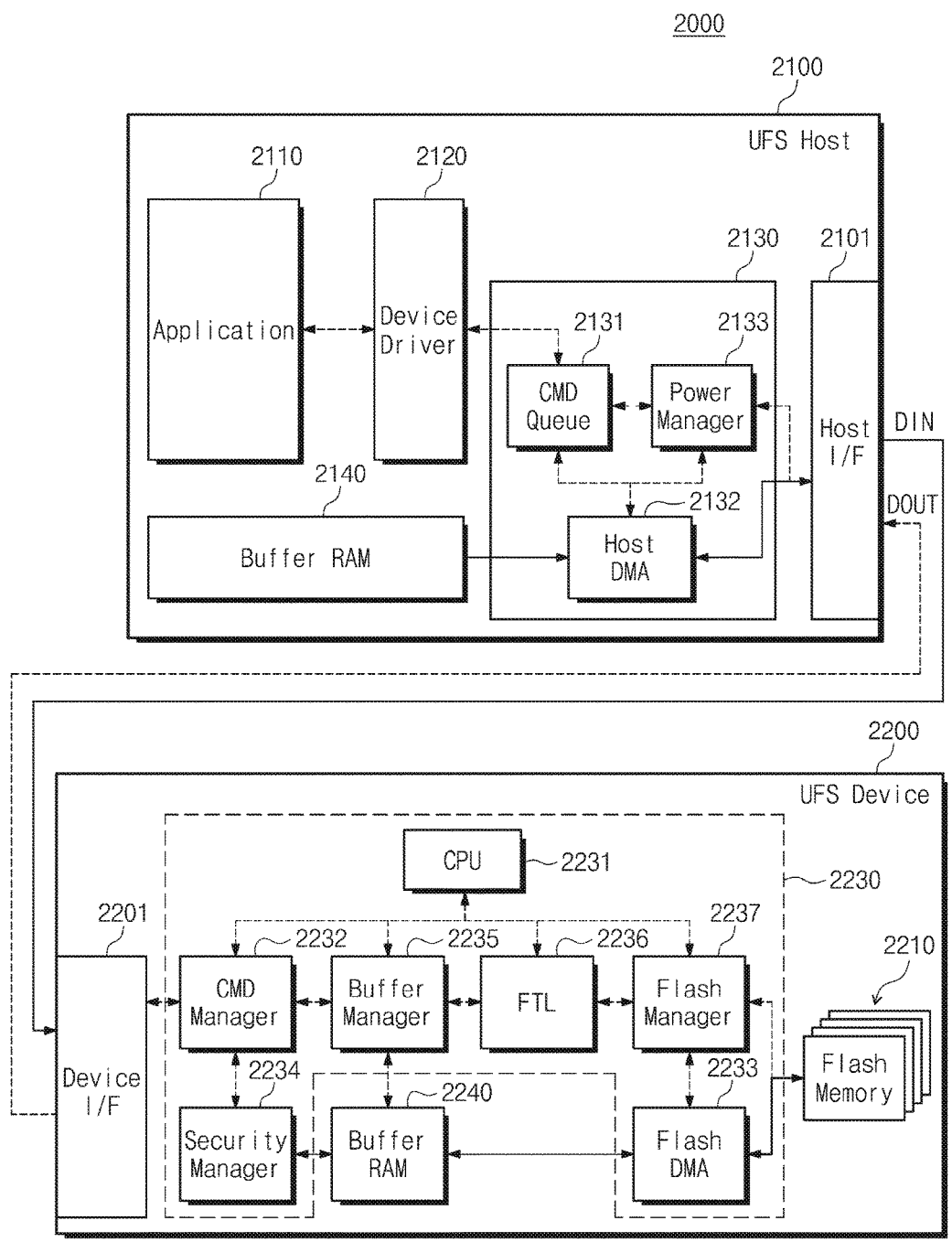
FIG. 11 is a block diagram illustrating a universal flash storage (UFS) system, according to an example embodiment.

FIG. 11 is a block diagram illustrating a universal flash storage (UFS) system 2000, according to an example embodiment. Referring to FIG. 11, the UFS system 2000 may include a UFS host 2100 and a UFS device 2200.

The UFS host 2100 may include an application 2110, a device driver 2120, a host controller 2130, and a buffer RAM 2140. The host controller 2130 may include a command (CMD) queue 2131, a host DMA 2132, and a power manager 2133. The command queue 2131, the host DMA 2132, and the power manager 2133 may operate as an algorithm, software, or firmware in the host controller 2130.

Commands (e.g., a write command) that are generated in the application 2110 and the device driver 2120 of the UFS host 2100 may be input to the command queue 2131 of the host controller 2130. The command queue 2131 may store commands to be provided to the UFS device 2200 in order. A command stored in the command queue 2131 may be provided to the host DMA 2132. The host DMA 2132 may send the command to the UFS device 2200 through a host interface (I/F) 2101.

Continuing to refer to FIG. 11, the UFS device 2200 may include a flash memory 2210, a device controller 2230, and a buffer RAM 2240. The device controller 2230 may include a CPU 2231, a command manager 2232, a flash DMA 2233, a security manager 2234, a buffer manager 2235, a flash translation layer (FTL) 2236, and a flash manager 2237. Here, the command manager 2232, the security manager 2234, the buffer manager 2235, the flash translation layer 2236, and the flash manager 2237 may operate as an algorithm, software, or firmware in the device controller 2230.

A command that is input from the UFS host 2100 to the UFS device 2200 may be provided to the command manager 2232 through a device interface 2201. The command manager 2232 may interpret the command from the UFS host 2100 and may authenticate the input command by using the security manager 2234. The command manager 2232 may allocate the buffer RAM 2240 to receive data through the buffer manager 2235. If the command manager 2232 is ready to transfer data, the command manager 2232 transfers RTT (READY_TO_TRANSFER) UPIU to the UFS host 2100

The buffer manager 2235 may include the mapping table error correction circuit 115 described with reference to FIGS. 1 to 9. Accordingly, the buffer manager 2235 may perform an error correction operation on an address mapping table stored in the buffer RAM 2240 through one read operation.

The UFS host 2100 may transfer data to the UFS device 2200 in response to the RTT UPIU. The data may be transferred to the UFS device 2200 through the host DMA 2132 and the host interface 2101. The UFS device 2200 may store the provided data in the buffer RAM 2240 through the buffer manager 2235. Data stored in the buffer RAM 2240 may be provided to the flash manager 2237 through the flash DMA 2233. Also, the buffer RAM 2240 may store an address mapping table. The flash manager 2237 may store data at a selected address of the flash memory 2210 with reference to the address mapping table through the flash translation layer 2236.

If data transfer and program for a command are completed, the UFS device 2200 transfers a response signal to the UFS host 2100 through an interface and may provide notification that the command is completed. The UFS host 2100 may notify the device driver 2120 and the application 2110 whether the command corresponding to the response signal is completed and may end an operation corresponding to the corresponding command.

According to an example embodiment of the inventive concept, a memory system performs error detection and correction on an address mapping table that is stored in a DRAM, and is for a nonvolatile memory device, thus securing the reliability. Also, the memory system may quickly perform the error detection and correction on the address mapping table through one read operation.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While the inventive concept has been described with reference to embodiments, it will be apparent to those skilled in the art that various changes and modifications may be made without departing from the spirit and scope of the inventive concept. Therefore, it may be understood that the above example embodiments are not limiting, but illustrative.

What is claimed is:

1. A memory system comprising:
a nonvolatile memory device;
a dynamic random access memory (DRAM) configured to store an address mapping table for an access to the nonvolatile memory device; and
a central processing unit implementing a controller configured to:
store, in the DRAM, the address mapping table that is divided in units of address mapping data, each of the units having a size of an interface of the DRAM;
read, from the stored address mapping table, target address mapping data corresponding to a logical address that is received from a host, the target address mapping data comprising a target parity and physical addresses of the nonvolatile memory device;
divide the target address mapping data into the target parity and a target physical address chunk comprising a target physical address corresponding to the logical address;
detecting and correcting an error of the target physical address chunk, using the target parity; and
replace, with a new physical address, the target physical address corresponding to the logical address, in the target physical address chunk of which the error is corrected, to generate a new physical address chunk.

2. The memory system of claim 1, wherein the target parity is generated based on the target physical address chunk.

3. The memory system of claim 1, wherein the controller is further configured to:
generate a new parity, based on the new physical address chunk;
combine the new physical address chunk and the new parity to generate new address mapping data; and
store the new address mapping data in the DRAM.

4. The memory system of claim 3, wherein the controller is further configured to replace the target address mapping data in the DRAM with the new address mapping data.

5. The memory system of claim 1, wherein a capacity of the address mapping table is proportional to a capacity of the nonvolatile memory device.

6. A memory system comprising:
a nonvolatile memory device;
a DRAM configured to store an address mapping table for an access to the nonvolatile memory device; and
a central processing unit implementing a controller configured to:
store, in the DRAM, the address mapping table that is divided in units of address mapping data, each of the units having a size of an interface of the DRAM;
access the nonvolatile memory device by performing an error detection and correction on target address mapping data corresponding to the access among the stored address mapping table, the target address mapping data comprising physical addresses of the nonvolatile memory device and a target parity corresponding to the physical addresses,
wherein the controller comprises a mapping table error correction circuit connected to the DRAM and configured to perform the error detection and correction on the target address mapping data,
wherein the mapping table error correction circuit comprises a mapping table error correction decoder configured to:
divide the target address mapping data into a target physical address chunk and the target parity: and
detect and correct an error of the target physical address chunk, using the target parity, and
wherein the mapping table error correction circuit further comprises an address processor configured to replace, with a new physical address, a target physical address corresponding to the access, in the target physical address chunk of which the error is corrected, to generate a new physical address chunk.

7. The memory system of claim 6, wherein the address processor is further configured to obtain the target physical address corresponding to the access, from the target physical address chunk of which the error is corrected.

8. The memory system of claim 6, wherein the mapping table error correction circuit further comprises a mapping table error correction encoder configured to:
generate a new parity, based on the new physical address chunk; and
combine the new physical address chunk and the new parity to generate new address mapping data.

9. The memory system of claim 8, wherein the mapping table error correction encoder is further configured to replace the target address mapping data in the DRAM with the new address mapping data to store the new address mapping data in the DRAM.

10. The memory system of claim 6, wherein the mapping table error correction circuit is further configured to perform the error detection and correction on the target address mapping data through one read operation from the DRAM.

11. The memory system of claim 6, wherein the memory system comprises a solid state drive or a universal flash storage.

12. A method of controlling a memory system comprising a nonvolatile memory device and a dynamic random access memory (DRAM), the method comprising:
receiving, from a host, a request to translate a logical address that is used by the host to a target physical address of the nonvolatile memory device, the request comprising a new physical address corresponding to the logical address, for a write operation;
reading target address mapping data corresponding to the logical address of the received request, from pieces of address mapping data that are stored in the DRAM, the target address mapping data comprising a target parity and target physical addresses of the nonvolatile memory device;
correcting an error of the target physical addresses included in the target address mapping data, using the target parity;
outputting the target physical address corresponding to the logical address among the target physical addresses of which the error is corrected; and
replacing, with the new physical address of the received request, the target physical address corresponding to the logical address among the target physical addresses of which the error is corrected, to generate new physical addresses of the nonvolatile memory device.

13. The method of claim 12, wherein each of the pieces of the address mapping data has a size of a burst length of the DRAM.

14. The method of claim 12, further comprising:
generating a new parity, based on the new physical addresses;
combining the new physical addresses and the new parity to generate new address mapping data; and replacing the target address mapping data in the DRAM with the new address mapping data to store the new address mapping data in the DRAM.

15. The method of claim 12, wherein the correcting is performed through one read operation from the DRAM.

* * * * *